United States Patent
Asslaender et al.

(10) Patent No.: US 10,281,548 B2
(45) Date of Patent: May 7, 2019

(54) METHOD OF MAGNETIC RESONANCE WITH EXCITATION BY A PREWINDING PULSE

(71) Applicants: Universitaetsklinikum Freiburg, Freiburg (DE); Technische Universitaet Muenchen, Munich (DE)

(72) Inventors: Jakob Asslaender, Freiburg (DE); Juergen Hennig, Freiburg (DE); Steffen Glaser, Freiburg (DE)

(73) Assignee: UNIVERSITAETSKLINIKUM FREIBURG, Freiburg (DE)

( * ) Notice: Subject to any disclaimer, the term of this patent is extended or adjusted under 35 U.S.C. 154(b) by 740 days.

(21) Appl. No.: 14/652,129

(22) PCT Filed: Mar. 6, 2014

(86) PCT No.: PCT/EP2014/054328
§ 371 (c)(1),
(2) Date: Jun. 15, 2015

(87) PCT Pub. No.: WO2014/154461
PCT Pub. Date: Oct. 2, 2014

(65) Prior Publication Data
US 2015/0323631 A1   Nov. 12, 2015

(30) Foreign Application Priority Data

Mar. 27, 2013   (DE) .................. 10 2013 205 528

(51) Int. Cl.
| | |
|---|---|
| *G01R 33/561* | (2006.01) |
| *G01R 33/50* | (2006.01) |
| *G01R 33/46* | (2006.01) |

(52) U.S. Cl.
CPC ....... *G01R 33/561* (2013.01); *G01R 33/4616* (2013.01); *G01R 33/50* (2013.01)

(58) Field of Classification Search
None
See application file for complete search history.

(56) References Cited

U.S. PATENT DOCUMENTS

| | | | | |
|---|---|---|---|---|
| 4,947,119 A | * | 8/1990 | Ugurbil | G01R 33/446 324/300 |
| 5,280,245 A | | 1/1994 | Pauly | |

(Continued)

OTHER PUBLICATIONS

Nan-Kuei Chen, et al., "Removal of Intravoxel Dephasing Artifact in Gradient-Echo.." Magnetic Resonance in Medicine 42:807-812 (1999).

(Continued)

*Primary Examiner* — Jermele M Hollington
(74) *Attorney, Agent, or Firm* — Paul Vincent

(57) ABSTRACT

A method of magnetic resonance, in which a sample introduced in a measurement volume in an external magnetic field is excited by an excitation pulse and the signal formed by the transverse magnetization thus produced is read out by a receiving coil. The method is characterized in that a prewinding pulse is used as the excitation pulse, which prewinding pulse is characterized in that the formed transverse magnetization $M_\perp(\omega)$ of spins of different Larmor frequency $\omega$ after the pulse has a phase $\varphi_0(\omega)$, wherein $\varphi_0(\omega)$ as a function of $\omega$ within a predefined frequency range $\Delta\omega$ has an approximately linear course having negative slope, such that the spins refocus after an echo time defined by the pulse without an additional refocusing pulse being necessary.

19 Claims, 16 Drawing Sheets

(56) References Cited

U.S. PATENT DOCUMENTS

| | | | |
|---|---|---|---|
| 5,619,138 A | 4/1997 | Rourke | |
| 5,820,245 A | 10/1998 | Desmond | |
| 7,425,828 B2 | 9/2008 | Garwood | |
| 9,581,670 B2* | 2/2017 | Stemmer | G01R 33/56554 |
| 9,791,530 B2* | 10/2017 | Nielsen | G01R 33/54 |
| 2005/0127911 A1 | 6/2005 | Magland | |
| 2009/0230957 A1* | 9/2009 | Park | A61B 5/055 |
| | | | 324/307 |
| 2013/0141096 A1* | 6/2013 | Bottomley | G01R 33/50 |
| | | | 324/309 |
| 2017/0350954 A1* | 12/2017 | Nielsen | A61B 5/055 |

OTHER PUBLICATIONS

Piotr Kozlowski et al., "Highly Prefocused Selective Pulses ---A Tool for in Vivo $^{31}$P Spectroscopic Imaging", Journal of Magnetic Resonance Series B 104, 280-283 (1994).

M. Villa et al., "Optimization of Linear-Phase Selective Pulses", Proceedings of the Society of Magnetic Resonance, Aug. 6, 1994, p. 124.

S. Topp et al., "Late Self-Refocusing Frequency Seclective RF Pulses", Proceedings of the Society of Magnetic Resonance in Medicine, Aug. 14, 1993, p. 1183.

Stephen Pickup et al., "Efficient Design of Pulses with Trapezoidal Magnitude . . ." MRM 38-137-148 (1997).

Xi-Li Wu et al., "Delayed-Focus Pulses for Magnetic Resonance Imaging: An Evolutionary Approach", Magnetic Resonance in Medicine 20, 165-170 (1991).

Kelvin O. Lim et al., "Short TE Phosphorus Spectroscopy Using a Spin-Echo Pulse", MRM 32-98-103 (1994).

Klaus Scheffler et al., "Reduced Circular Field-of-View Imaging", MRM 40:474-480 (1998).

Arnold L. Bloom et al., "Nuclear Induction in Inhomogeneous Fields", Physical Review, vol. 98, No. 4, May 15, 1955.

Steven Conolly et al., "Optimal Control Solutions to the Magnetic Resonance . . . " IEEE Transactions on Medical Imaging, vol. MI-5, No. 2, Jun. 1986.

Steven Conolly et al., "Variable-Rate Selective Excitation", Journal of Magnetic Resonance 78, 440-458 (1988).

Gary H. Glover "Multipoint Dixon Technique for Water and Fat Proton . . . ", JMRI 1991; 1 :521-530.

E.L. Hahn et al., "Spin Echo Measurements of Nuclear Spin Coupling in Molecules", Physical Review, vol. 88, No. 5, Dec. 01, 1952.

J. Hennig et al., "RARE Imaging: A Fast Imaging Method for Clinical MR", Magnetic Resonance in Medicine 3, 823-833 (1986).

I. G. Kiliptari, "Single-pulse nuclear spin echo in magnets", Physical Review B, vol. 57, No. 18, May 1, 1998—II.

Priti Balchandani et al., "Self-Refocused Spatial-Spectral Pulse for Positive Contrast . . . " Magnetic Resonance in Medicine 62:183-192 (2009).

Jun Shen, "Delayed-Focus Pulses Optimized Using Simulated Annealing", Journal of Magnetic Resonance 149, 234-238 (2001).

Craig H. Meyer et al., "Simultaneous Spatial and Spectral Selective Excitation", Magnetic Resonance in Medicine 15, 287-304 (1990).

John Pauly, et al., "Parameter Relations for the Shinnar-Le Roux Selective . . . ", IEEE Transactions on Medical Imaging, vol. 10, No. 1, Mar. 1991.

Stefan Posse et al., "In Vivo Measurement of Regional Brain Metabolic Response to Hyperventilation Using Magnetic . . . ", MRM 37:858-865 (1997).

Claudia Prieto et al., "3D Undersampled Golden-Radial Phase Encoding for DCE-MRA . . . ", Magnetic Resonance in Medicine 64:514-526 (2010).

Scott B. Reeder et al., "Water-Fat Separation With IDEAL Gradient-Echo Imaging", Journal of Magnetic Resonance Imaging 25:644-652 (2007).

\* cited by examiner

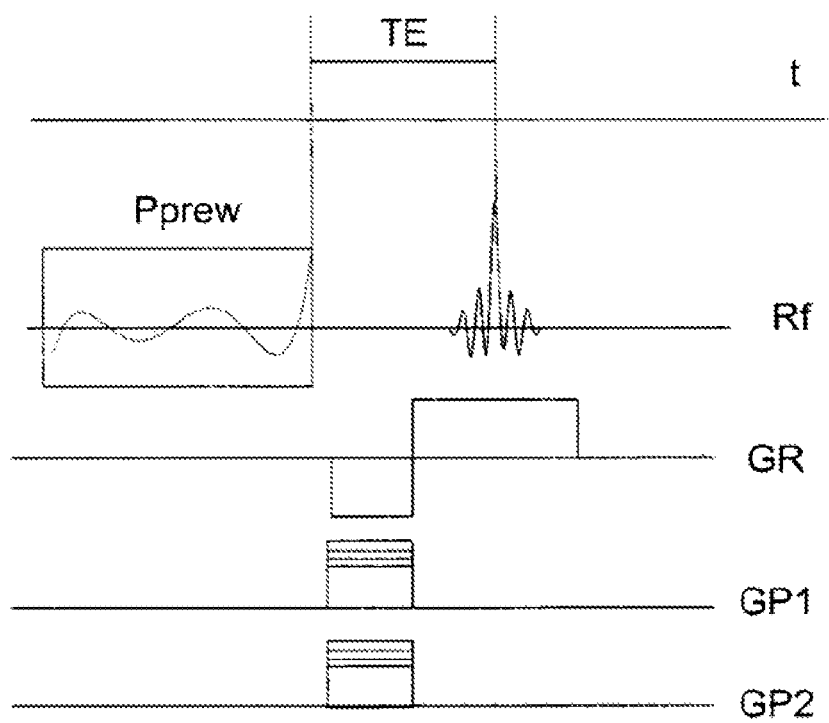

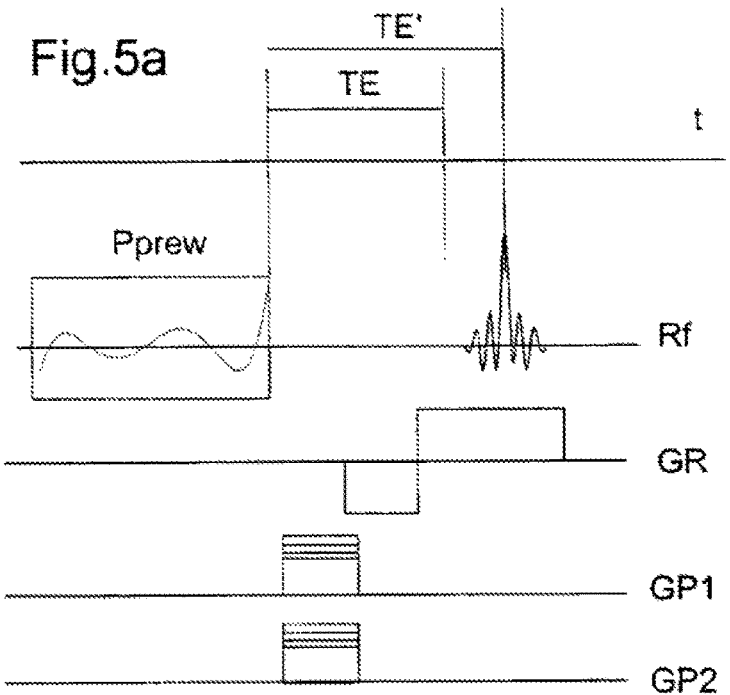
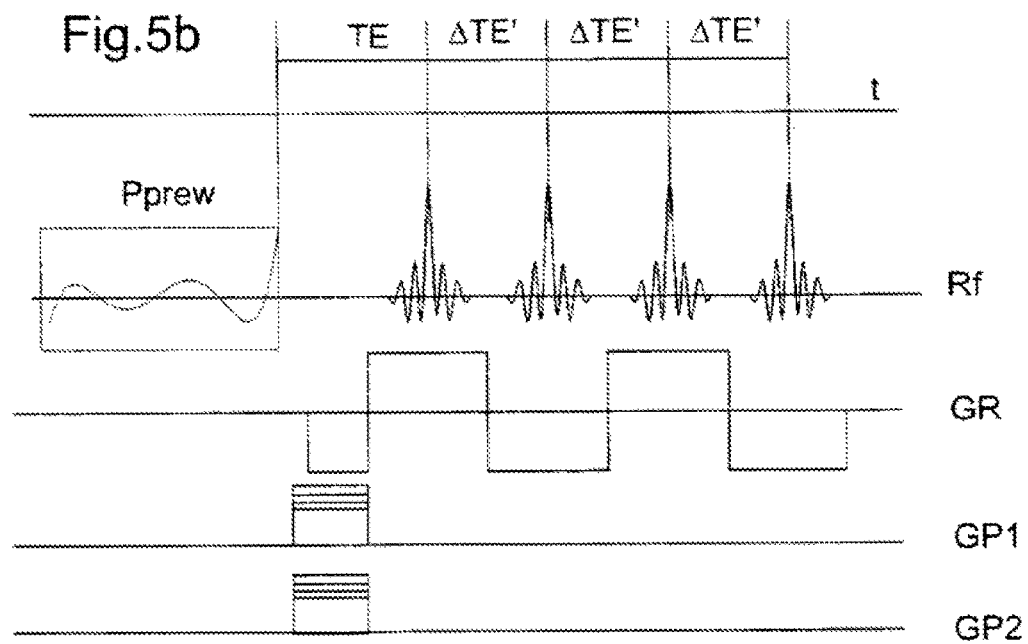

Fig. 8
a) 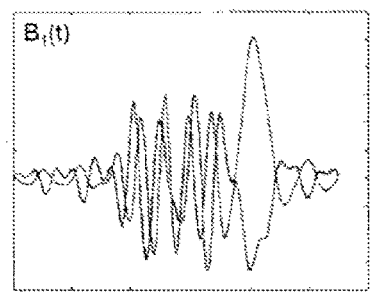
b) 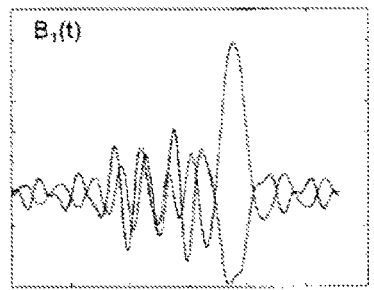
c) 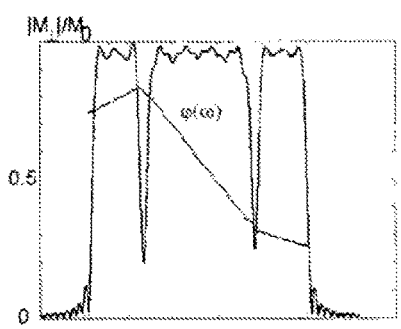
d) 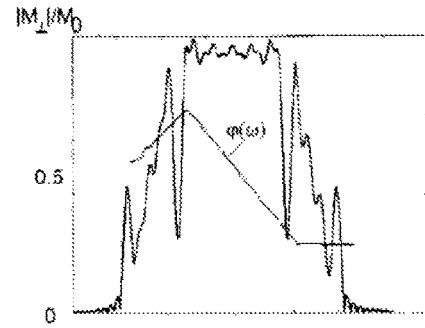

Fig.15
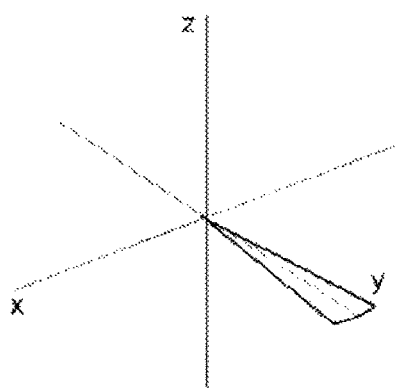
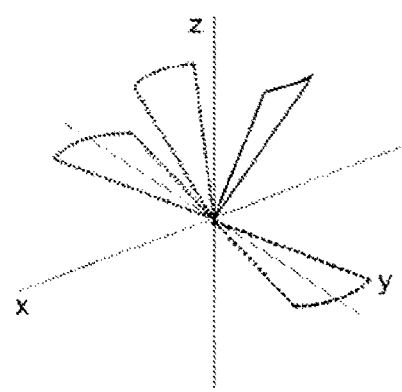

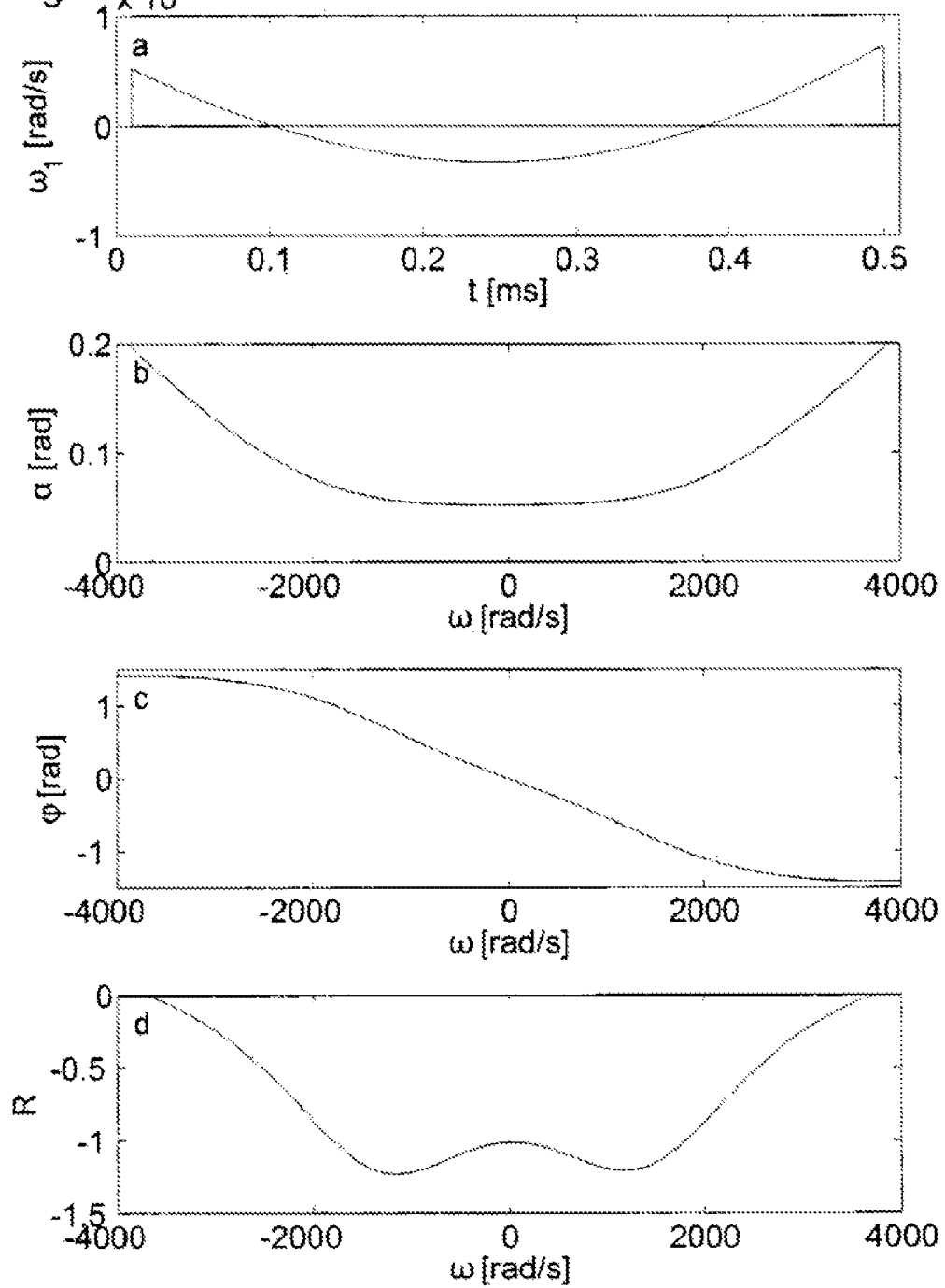

METHOD OF MAGNETIC RESONANCE WITH EXCITATION BY A PREWINDING PULSE

This application is the national stage of PCT/EP2014/054328 filed Mar. 6, 2014 and also claims Paris convention priority from DE 10 2013 205 528.5 filed Mar. 27, 2013.

BACKGROUND OF THE INVENTION

The invention concerns a method of MR (=magnetic resonance), in particular NMR (=Nuclear Magnetic Resonance), MRT (=Magnet Resonance Tomography), MRI (=MR imaging) and/or spatially resolved MR spectroscopy by means of an MR tomograph, in which a sample introduced in a measurement volume in an external magnetic field is first excited by an excitation pulse and the signal formed by the transverse magnetization thus produced is then read out after a time interval by a receiving coil.

Such a method is known from Hahn, E. L., Maxwell, D. E., 1952. Spin echo measurements of nuclear spin coupling in molecules. Physical Review 88, 1070 (=reference [5]).

This invention concerns a method of magnetic resonance (NMR=Nuclear Magnetic Resonance or MRT=Magnetic Resonance Tomography) in which a single excitation pulse is used to generate refocused magnetization ('spin echo') at an instant TE (time echo) after the pulse. An echo after a single pulse, termed 'edge echo,' was observed as early as 1955 (see references [1] and [7]), however the experimental conditions described therein are unsuitable for practical application. The 'single pulse echo' appears there only as a small secondary signal due to the technically associated imperfections of a rectangular pulse used for conventional excitation.

Also known from the literature (see, for example, references [7a] to [7d]) are so-called 'delayed focus' pulses, which conceptually result from the superposition of the excitation and refocusing pulse required to produce a spin echo, so that the spin echo is formed at an instant that is shorter than the duration of the pulse.

In contrast thereto, the inventive method described in more detail below is based on specifically phase- and amplitude-modulated excitation pulses for flexible and efficient production of self-refocusing transverse magnetization.

Whereas, with this class of methods, the measuring signal contained in the spin echo is not read out until a corresponding time delay has elapsed after the excitation pulse, with other MRT measuring methods, a completely different time sequence is possible. Reference [14], for example, describes a method in which the signal is read out intermittently during a radio-frequency pulse used for excitation. This is achieved by dividing the excitation pulse into a grid of very short single pulses. This is therefore a technically wholly different MRT measuring method from the spin echo method described above, which is the point of departure for this invention.

Magnetic resonance, referred to hereinafter as MR, is based on measurement of the transverse magnetization of a sample, which is introduced into an external magnetic field. 'Sample' is used here as a generic term and can mean a measuring sample to be analyzed or, in animal experiments, an experimental animal or, in human applications, a test-person or patient.

Nuclear spins contained in the sample are excited by a radio-frequency pulse (=RF) using transmit coils placed in the examination volume. The excited spins precess according to the Larmor condition at a frequency $\omega$, which is proportional to the magnetic field $B_0$ at the position of the spin:

$$\omega = \gamma B_0. \quad (1)$$

where $\gamma$ is the gyromagnetic ratio. The object of the measurement (using receiving coils) is the signal located in the region of the sensitive volume of the receiving coils, which is formed as the sum of the transverse magnetization of the excited spins. Due to inhomogeneities of the magnetic field across the examination volume, spins have different resonance frequencies at different locations.

$$\omega = \omega_0 \pm \delta\omega, \quad (2)$$

where $\delta\omega$ is referred to as the off-resonance frequency. Signals of spins each having a defined resonance frequency $\omega$ are termed isochromates. In dependence on the off-resonance frequency $\delta\omega$, a dephasing of the signal components of different isochromates occurs, i.e., the amplitude of the measured signal (called free induction decay (=FID)) decreases. Dephasing as a function of the Larmor frequency $\omega$ corresponds to the slope $d\varphi/d\omega$ of the phase $\varphi(\omega,t)=\omega t+\varphi_0(\omega)$ of the isochromates. Where $\varphi_0(\omega)$ is the phase after excitation. During FID, $d\varphi/d\omega$ constantly increases and, after an adequate duration of free precession, is always positive.

By contrast, reference [15] describes a method for producing transverse magnetization that exhibits a constant phase.

To simplify the description without restricting its general applicability, a rotating reference system can be assumed such that $\omega_0 \equiv 0$.

The signal decay caused by the dephasing described above is characterized by the decay constant T2*. For measurements in MR tomography, T2* is typically in the range of 5 to 100 ms. If a realistic excitation pulse with a finite duration is used—in accordance with the excitation profile of the pulse—the isochromates are already dephased by the end of the pulse. For simple, symmetrical pulses with a simple profile (Gauss, Sinc, etc.) used in MR tomography, the dephasing accumulated during the pulse corresponds to the free dephasing across half of the pulse duration.

The local field inhomogeneity is caused by the technical inhomogeneities of the magnet used and by different susceptibility properties of the materials or tissue contained in the sample. The measurement of T2* can therefore provide important information about the tissue properties. The decay constant T2* is given by 1/T2*=1/T2+1/T2', where the transverse relaxation time T2 results from magnetic field fluctuations and T2' results from static magnetic field inhomogeneities. T2' decay is not desirable for the measurement of other parameters such as T2, proton density and the longitudinal relaxation T1.

Dephased isochromates can be rephased by spin echo formation (see reference [5]). Here, a refocusing pulse is used at an instant t=TE/2, which inverts the accumulated phase of the isochromates. As the phase develops, all isochromates are rephased according to their respective frequency at echo time TE and a spin echo is formed. This refocusing is only possible for the static component T2'; refocussing of the T2 decay is fundamentally impossible.

Spin echo formation is one of the most important measuring methods in MR tomography, especially in the form of the so-called TSE (turbo spin echo) technique (originally RARE (Rapid Acquisition with Relaxation Enhancement), also termed FSE (=Fast Spin Echo)) (see reference [6]), which is based on the formation of multiple spin echoes by repeated refocusing. Combined pulses, which consist of the excitation pulse and the refocusing pulse, will be referred to hereinafter as Hahn pulses.

Spin echo formation by means of Hahn pulses is, however, also subject to restrictions. The application of a refocusing pulse requires a certain minimum time (typically 1 to 5 ms when MR tomography is used on humans), and the minimum echo time is therefore limited. Moreover, the z-magnetization present due to the refocusing pulse is also inverted. In the case of methods commonly used in MR tomography, which are based on multiple excitations with a repetition time TR (=Time Repetition), signal saturation occurs, which becomes stronger the shorter TR is in comparison with the longitudinal relaxation time T1. Because T1 is in the range of 0.5 to 2 s for biological tissue, spin echo experiments are usually performed with a TR of approx. 0.5 to 10 s.

MR tomography, also known as magnetic resonance imaging (=MRI), MR imaging, or magnetic resonance tomography (=MRT), is a non-invasive method, which makes it possible to resolve and represent the inner structure of objects, spatially in three dimensions. It is based on the energy behavior of atomic nuclei in a magnetic field, which permits excitation of their nuclear spins by means of suitable radio-frequency pulses and subsequent analysis of the reaction. MRT imaging is used above all in medicine, in order to obtain views of the interior of the human body.

The signal of the atomic nuclei of the object under examination, which is irradiated as a reaction to the excitation with radio-frequency pulses, is read out with suitable receiving coils. The spatial encoding required to be able to allocate the measurement signal to a location within the object to be imaged is performed by additional, spatially varying, magnetic fields $B_z(x,y,z,t)$, which are superimposed on the static main magnetic field $B_0$ and cause the atomic nuclei to have different Larmor frequencies at different locations. Conventionally, magnetic fields with as linear a change of strength as possible along the respective spatial direction, so-called constant or linear magnetic field gradients, are used for this purpose. Conventional gradient systems generate three orthogonal gradients in the x-, y- and z-direction. However, local gradient systems are also used in spatial coding. 1-, 2- or 3-dimensional spatial encoding is applied by varying the magnetic field gradient in all three spatial directions in accordance with known principles, i.e. Fourier encoding, filtered back projection, or another known method.

Time-variable magnetic field gradients and RF pulses are superimposed on a steady-state magnetic field in order to produce a signal that can be used for MRT.

The object of this invention is therefore to present an MR method of the type described in the introduction that achieves the following:
1) Production of a spin echo by means of a single pulse, which prepares the spin system in such a way that spontaneous self-refocusing arises.
2) Production of a spin echo having a variable echo time with no lower limit.
3) Production of a spin echo by means of a pulse having a small flip angle, such that signal saturation is reduced in periodic application of the pulse with short repetition times.
4) Production of a spin echo that is further away from the end of the pulse than the length of the pulse itself.
5) A longer echo time in the case of short pulses and a limited B1 amplitude.

SUMMARY OF THE INVENTION

According to the invention, this object is achieved in a surprisingly simple but effective manner whereby a so-called "prewinding pulse" is used as the excitation pulse, the prewinding pulse being characterized in that the formed transverse magnetization $M_\perp(\omega)$ of spins of different Larmor frequency $\omega$ after the excitation pulse has a phase $\varphi_0(\omega)$, wherein $\varphi_0(\omega)$, as a function of $\omega$ within a predefined frequency range $\Delta\omega$ has an approximately linear course having negative slope, such that the spins refocus after an echo time defined by the excitation pulse after the end of the excitation pulse, the echo time being larger than the duration of the excitation pulse, without an additional refocusing pulse being necessary.

The inventive method is based on the concept of production of a spin echo without a refocusing pulse. According to the inventive idea, this is achieved by using a special excitation pulse that produces negative dephasing ($d\varphi_0/d\omega<0$) across a desired frequency range $\Delta\omega$. After excitation by such a pulse, rephasing of the spin takes place with free precession and, without a refocusing pulse, a spin echo is formed at the echo time $TE=-d\varphi_0/d\omega$, which is thus defined by the pulse.

In the case of a Hahn pulse, the spin echo is formed in 4 phases:
1.) Excitation
2.) Free induction decay FID
3.) Refocusing pulse
4.) Rephasing.

The refocusing pulse here has the effect of a symmetry operator; spin echo formation occurs automatically as a result of the time symmetry of the phase evolution of the spins in FID and of the rephasing. The spin echo formation is dependent only on the pulse distance TE/2, not on the off resonance $\delta\omega$. However, the range of acquired spins can, of course, be limited by the use of selective pulses.

Spin echo formation also takes place if refocusing pulses with flip angles smaller than 180 degrees are used. However, in the case of a smaller flip angle, only the component of the B1 field that, in a vector analysis, contains a 180 degree pulse component will result in spin echo formation, which does not therefore restrict the above discussion. The pulse sequence 90°-180° produces the largest echo. Small flip angles, both for the excitation pulse and for the refocusing pulse, produce smaller echoes with a poorer signal-to-noise ratio (=SNR). For practical applications, a total flip angle (sum of the excitation and refocusing pulse) of $\alpha \gg 0$ is therefore needed. If the spin echo formation is repeated quickly, signal saturation therefore occurs. Hahn pulses are therefore not suitable for fast imaging with a short TR.

In this inventive method, spin echo formation is not based on a symmetry operation. The spins are prepared with a single pulse and the phase evolution of the spins has no symmetry. In consequence thereof, the pulse has no symmetry operator (=refocusing pulse). The echo time is therefore not exclusively dependent on the distance between the excitation and refocusing pulse. By modifying the profile of the pulse, TE can be freely varied (of course, within the limits defined by the Bloch equations). Precise definition of the maximum possible TE is a problem, which has not so far been solved theoretically. Basic considerations assume that, under conditions relevant to practice, it is in the range of the pulse duration. For small frequency ranges $\Delta\omega \ll 1/tp$, where tp corresponds to the pulse duration, it can be demonstrated that echo times can also be produced that are larger than the pulse length.

In practical applications, especially in human MRT, the minimum echo time of spin echo formation has a lower limit: both the 90° pulse and, above all, the 180° pulse require a finite time. Especially in the case of the 180° pulse, the minimum pulse duration has a lower limit due to the available pulse power.

A variant of the inventive method is especially preferred in which the time profile of the amplitude and phase of the "prewinding pulse" is calculated by solving the Bloch equation inversely and producing the "prewinding pulse" accordingly. For small flip angles, a linear approximation hereto is possible. This method of producing the prewinding pulse has the advantage that it can be achieved very quickly and without complicated optimization. It is only precise for small flip angles but can, depending on the circumstances, result in useable results for flip angles of up to 90°.

In a further preferred variant of this invention, the "prewinding pulse" is calculated by the Shinnar-Le Roux method. In this case, the linear inversion problem is first solved. The solution is then adapted to the nonlinear Bloch equation so that it is satisfied exactly. The allows for better control of the produced pulse profiles than the linear approximation and also makes it possible to optimize the pulse profile with respect to secondary parameters, such as pulse duration, maximum amplitude, etc.

An alternate variant of the above method is also advantageous, which is characterized in that the "prewinding pulse" is calculated by means of the optimal control method. Here, the non-linear Bloch equation is already satisfied exactly during the optimization process using Lagrange multipliers. This method is theoretical and takes a long time to calculate, but permits free control of all relevant parameters.

An embodiment of the invention that is particularly suitable for imaging methods (MRI/MRT) is characterized in that the produced signal is read out spatially encoded in 1, 2, or 3 dimensions by means of time-variable magnetic field gradients, wherein the spatial encoding is performed according to one of the imaging methods known from prior art (such as, for example, Fourier encoding, radial or spiral imaging).

In a further embodiment of this invention, the self-refocused signal is read out after a delay (with respect to the echo time) and thus undergoes defined, freely selectable T2*-dependent modulation of the amplitude and/or phase. With respect to the readout scheme used, this corresponds to a gradient echo method but, in contrast thereto, permits readout while the isochromate is in a state of complete coherence, that is, without T2*-related dephasing.

The two embodiments of the invention described above can be advantageously further developed so that the produced signal is read out one or more times at incremental readout times by single or multiple gradient inversion.

Alternately, in another preferred variant of the method, the "prewinding pulse" is applied under a slice selection gradient with strength Amp, wherein the latter is switched off after the end of the pulse and in such a way that the time integral under the gradient corresponds to the action integral Amp*TE required for self-refocusing. This causes all spin isochromates to be in phase after the slice selection gradient is switched off and makes a rephasing gradient in the opposite direction unnecessary.

This method variant can be further developed by having the formed signal read out under a readout gradient GR.

A further preferred variant of the invention is characterized in that both the "prewinding pulse" and the formed signal occur under a spatially encoded gradient GR, and possibly a repetition of the acquisition occurs in a spatial direction other than the 2- and 3-dimensional radial spatial encoding. After the end of the pulse, the edge of k-space has already been reached, so that the latter can be read out directly radially. A gradient inversion is not required. This results in a time saving as well as a reduction in peripheral nerve stimulation caused by the variation in the magnetic field over time.

A further alternate variant of the invention is characterized in that both the "prewinding pulse" and the formed signal occur under a spatially encoded gradient GR, and a possible repetition of the acquisition occurs with different phase encoding steps between excitation and data readout. As in the previous point, immediately after the end of the excitation pulse (possibly after the end of the phase encoding), the signal can be read out without having to invert the readout gradient.

A preferred use variant of the last three mentioned embodiments of the inventive method is characterized in that the "prewinding pulse" is used under a time-variable gradient according to the VERSE method. The possibilities provided by this include reducing B1 peaks. Alternately, parts of the pulse with low B1 fields can be shortened and therefore shorter pulses can be produced.

The method can furthermore be used for spatio-spectral pulses. Slice-selective pulses are normally emitted during a constant slice gradient. A linear magnetic field gradient assigns a Larmor frequency $\omega=\omega_0+\gamma \vec{G} \cdot \vec{r}$; to each position along the gradient, wherein $\vec{G}$ is the gradient and $\vec{r}$ is the spatial position. However, if different Larmor frequencies are considered therein, as they arise due to magnetic field inhomogeneities, the following results from equation (2)

$$\omega=\omega_0+\delta\omega+\gamma \vec{G} \cdot \vec{r}; \qquad (3)$$

The position and off-resonance cannot be clearly separated from each other. However, if gradients that vary over time are applied during the pulse, the spatial position and spectral frequency can be separated from each other (see reference [8]). This concept can be applied to inventive pulses to achieve the desired frequency response to magnetic field inhomogeneities $\delta\omega$ and, at the same time, only to excite part of the sample.

The excitation pulse can be chosen such that it initially takes the magnetization to flip angles defined by $\alpha_z < \alpha(t) < \pi - \alpha_z$. As a consequence, the magnetization accumulates a phase ramp $d\varphi/d\omega$, which is amplified at the end of the pulse and inverted by taking the magnetization to the smaller target flip angle $\alpha_z$.

In further advantageous variants of the inventive method, the excitation pulse can be chosen such that, with a limited maximum pulse amplitude, $Rmax(\alpha) < Rmax(90°)$ is achieved with a negative sign, or such that the excitation pulse has a constant amplitude and one or more phase jumps, or such that the amplitude of the excitation pulse is shaped and changes sign at one or more points.

Further advantages of the invention result from the description and the drawing. The features stated above and further below can also be used singly or together in any combination according to the invention. The embodiments shown and described are not intended to be an exhaustive list, rather are examples to explain the invention.

The invention is shown in the drawing and is explained in more detail using embodiments.

BRIEF DESCRIPTION OF THE DRAWING

The figures show:

FIG. 4 an exemplary sequence for use of the prewinding pulse in conjunction with an imaging method of 3D Fourier encoding. Rf characterizes the prewinding pulse Pprew, which in this case acts on the entire sample, and the self-refocused signal produced after TE, GR the readout, and GP1 and GP2 the two phase encoding gradients;

FIG. 5a a sequence as in FIG. 4, but with delayed readout for production of a signal with defined T2* weighting, which can be varied in any way;

FIG. 5b a sequence as in FIG. 5a, but with multiple readout of the produced self-refocused signal at incrementally shifted echo times;

FIG. 8 an exemplary modulation of the phase course outside the target range $\Delta\omega$. Due to the Fourier shift theorem, echo formation occurs at different instants, depending on the slope $d\varphi_0/d\omega$. In the case of a positive slope, the echo time is, theoretically, before the end of the pulse and therefore not accessible. In the case of the pulses in a) and b), the continuous line represents the real and the dashed line the imaginary part of the pulse. In the associated frequency responses in c) and d), the continuous line represents the absolute value and the dashed line the phase of the frequency response;

FIG. 15 the principle of inventive pulses: The phase distance of the spins, which were accumulated near to the equator (A), is enlarged by the transition to smaller flip angles (B). In (B), the projection of the magnetization onto the equator is additionally shown to illustrate the enlargement of the split (dashed). If the magnetization is guided through the pole, the phase course is inverted, which results in the formation of an echo (dotted); and FIG. 16 a pulse, which was calculated by means of 'Optimal Control' (a) in a limited range of off-resonance frequencies, it shows an approximately linear phase course at the end of the pulse for an approximately constant flip angle (b, c). In the optimized frequency range, the |R| values are slightly above 1 (d).

DESCRIPTION OF THE PREFERRED EMBODIMENT

As already mentioned above, the inventive method is based on the concept of a spin echo formation without a refocusing pulse, which is achieved by using a special excitation pulse, which produces dephasing of negative slope with respect to the frequency ($d\varphi_0/d\omega<0$) over a desired frequency range $\Delta\omega$. After excitation with such a pulse, rephasing of the spins is performed with free precession and, without a refocusing pulse, a spin echo is formed at the echo time TE=$-d\varphi_0/d\omega$, which is thus defined by the pulse.

Figure 1A:
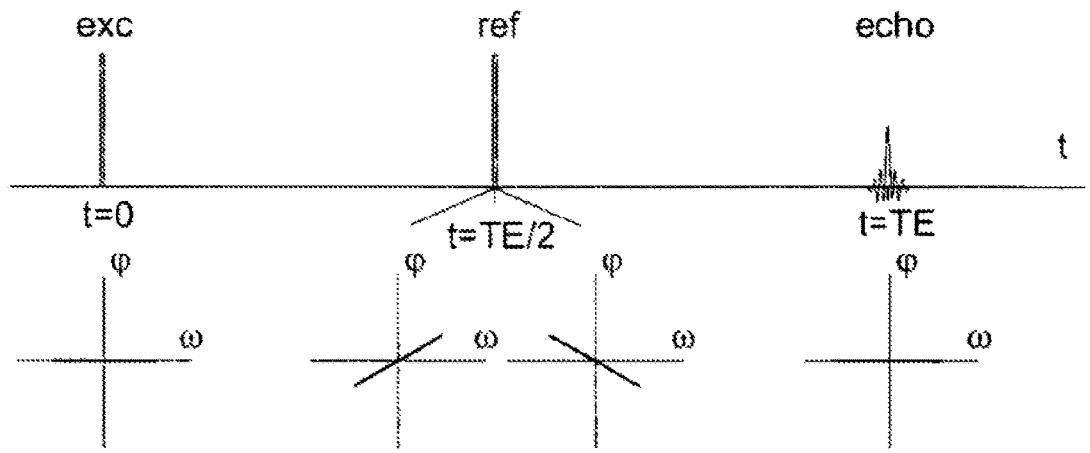
FIG. 1a a schematic view of the pulse sequence of a spin (Hahn) echo sequence, in which the excitation pulse (exc) is a rectangular pulse of negligible length. The accumulated phase ramp is inverted by the refocusing pulse (ref) so that an echo arises at the echo time TE.
Figure 1B:
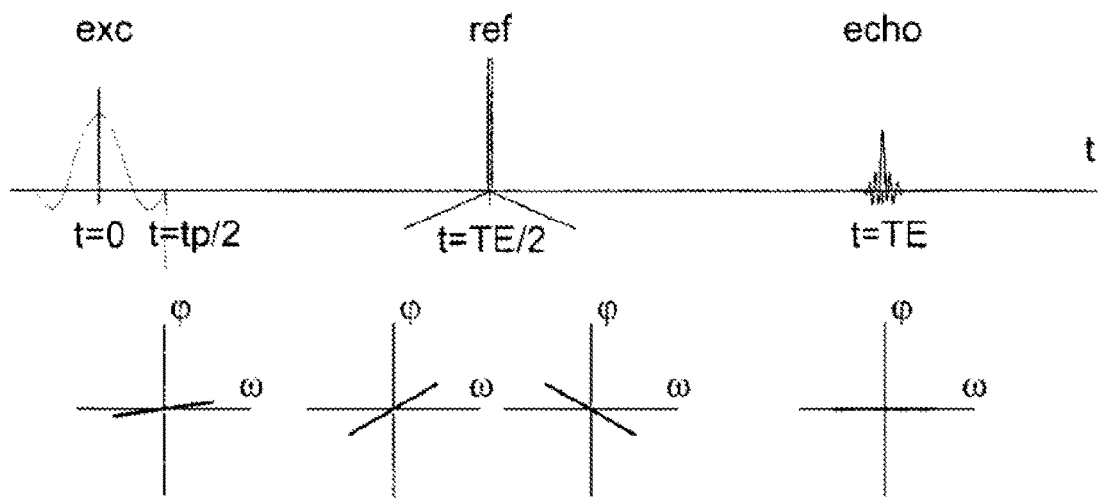
FIG. 1b the pulse diagram as in FIG. 1a, but with a Sinc pulse of finite length. Already at the end of the pulse, the spins have accumulated a phase ramp of $d\varphi/d\omega = -tp/2$, wherein tp is the length of the pulse.
Figure 2:
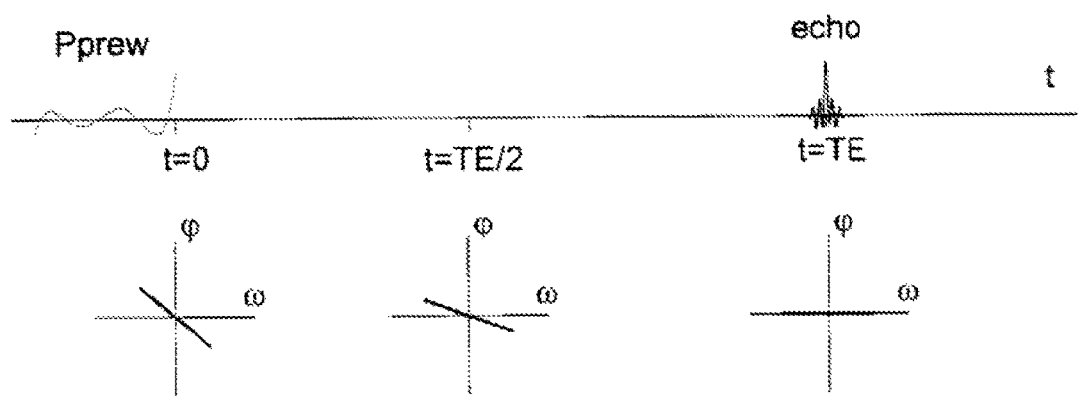
FIG. 2 the basic principle of the inventive method. A (still to be defined) prewinding pulse Pprew generates transverse magnetization with a linear phase course with a negative slope with reference to the frequency dependence. Due to free induction decay, the magnetization of the excited isochromates develops so that an echo is formed at instant TE, without a further refocusing pulse.

This principle of the invention is outlined in FIG. 2.

Such a pulse designated 'phase pre-winding pulse' can be generated by solving the Bloch equation for the stated conditions, wherein in the following consideration, T1 and T2 relaxation are ignored and only the free precession of the magnetization in the presence of the static magnetic field inhomogeneities and the effects caused by the time-variable $B_1$ field of the excitation pulse are considered:

In the so-called small-angle approximation, the non-linear Bloch equation can be linearized. In this approximation, a Fourier relation exists between the pulse and its frequency response. If the relaxed magnetization $\vec{M}_0=(0,0,1)^T$ is assumed before the pulse, the following results for complex transverse magnetization $M_\perp = M_x + iM_y$ after the pulse $$\vec{M}_\perp = E \cdot \vec{x}. \quad (4)$$

The vector $\vec{M}_\perp$ has the elements $M_{\perp,k}=|M_\perp|\cdot\exp(-i\omega_k TE)$, E is a matrix with the elements $E_{k,n}=\exp(i\omega_k n\Delta t)$ and $\vec{x}$ describes the sought pulse. $\omega_k$ extends in sufficiently small steps to satisfy the Nyquist criterion over the frequency range $\Delta\omega$, in which the pulse is to achieve the desired effect. The absolute value of the transverse magnetization results from the desired flip angle $|M_\perp|=\sin(\alpha)$. The so-called dwell time $\Delta t$ describes the digital sampling rate of the variable $B_1$ field so that the pulse $\vec{x}$ has length $n\cdot\Delta t$. Because E is generally not quadratic and is ill-conditioned, a regularized Moore-Penrose pseudoinverse is used to provide the solution.

$$\vec{x} = E^H(EE^H+\lambda^2 1)^{-1}\vec{M}_\perp. \quad (5)$$

The Tikhonov regularization used here minimizes the irradiated energy of the $B_1$ field. The regularization parameter $\lambda$ trades the accuracy of the inversion off against minimization of the energy of the $B_1$ field.

The solution obtained in this way can be used either directly as a pulse in linear approximation, or be applied to the non-linear Block equation by means of the Shinnar-Le Roux method to solve the equation exactly (see reference [9]).

Alternately, it is possible to calculate inventive pulses by means of the 'Optimal Control' method (see reference [3]). The pulse is represented as a 'control' that is optimized to minimize a cost function.

The desired frequency response can optionally be exactly satisfied, or the distance from the desired frequency response can be minimized. Satisfying the Bloch equation is ensured by a Lagrange multiplier. The Bloch equation is therefore also exactly satisfied in the optimal control method.

Figure 3:
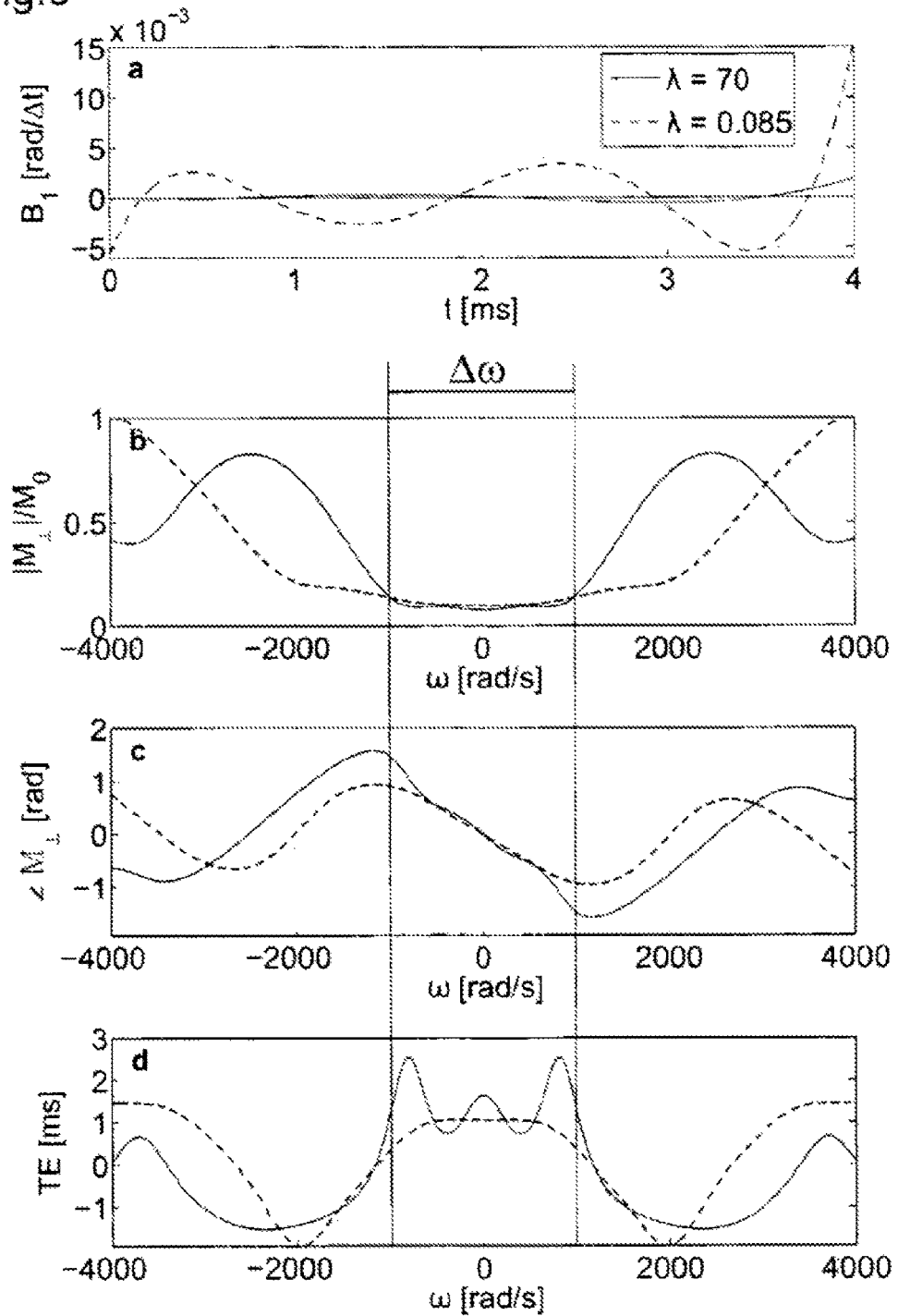
FIG. 3a exemplary inventive pulses that have been calculated in small-angle approximation by regularized matrix inversion. If a larger regularization parameter is chosen, the energy of the $B_1$ field is reduced.
FIG. 3b-d the frequency response of the inventive pulses. The magnetization has a negative phase ramp (c) in the target range $-1000 \text{ rad/s} \leq \omega \leq 1000 \text{ rad/s}$. The linearity thereof declines with larger regularization parameters. The echo time in (d) is calculated from the negative slope $TE = -d\omega_0/d\omega$.

FIG. 3(a) shows a solution in small-angle approximation by way of example. In this case, $-1000$ rad/s $\leq \omega_k \leq 1000$ rad/s, $|M_\perp|/M_0=0.1$, and TE=1.5 ms (measured from the end of the pulse) were selected. The dwell time is 1 μs and the pulse length 4 ms. FIGS. 3(b-d) show the frequency response of the pulse that was calculated by means of Bloch simulations (see reference [9]).

In the frequency response in FIG. 3(b), the target range is a local minimum with respect to the flip angle. Outside this frequency range, the flip angle is comparatively large. This means the longitudinal magnetization is largely destroyed and can scarcely recover with short repetition times (TR<<T1). This can be used in a targeted way to suppress signals of unwanted Larmor frequencies (e.g. fat using the chemical shift). Analogously, it is possible to choose a very small flip angle for unwanted frequency ranges, which also causes signal suppression in these ranges. Optimization of the inventive pulses for suppression of certain Larmor frequencies can be achieved, for example, by additional parameters in the cost function (in all methods presented), or by Lagrange multipliers.

A preferred group of applications of the inventive method is shown in FIG. 4. A global prewinding pulse is used in conjunction with three-dimensional Fourier spatial encoding. Here, Rf shows the prewinding pulse Pprew and the echo formed after time TE. GR corresponds to the readout gradient for spatial encoding along the freely selectable first spatial coordinate, GP1 and GP2 the phase encoding gradients in the two other orthogonal spatial directions. If the Pprew pulse were replaced with a conventional excitation pulse, this would be the same as a 3D gradient echo method.

In a preferred implementation of this method, $\Delta\omega$ is chosen such that it covers the entire range of the variation of the Larmor frequency of the nuclear spins caused by field inhomogeneities in the volume to be imaged. Unlike conventional gradient echo methods in which the formed signal is phase- and amplitude-modulated by T2* decay caused by inhomogeneities, with use of Pprew, the formed signal is refocused with respect to the field inhomogeneities. Such an implementation is especially suitable for examination of inhomogeneous samples without T2* signal loss.

By analogy with the methods shown, many of the other methods known from the literature for spatial encoding (e.g. radial imaging, spiral imaging, and others) can be combined with the inventive prewinding pulse.

The instant of spontaneous refocusing TE does not necessarily have to match the gradient echo instant caused by inversion of the readout gradient (FIG. 5a). In the case of delayed formation of the gradient echo at an instant TE', a signal is formed that is influenced in its amplitude and/or phase by T2* and/or chemical shift within the time difference TE'-TE. This can be used, in particular, to implement fast data readout with a small time difference TE'-TE, which is not accessible to direct readout. Due to variation of TE' or also due to multiple inversion of the readout gradient GR (FIG. 5b), multiple signals with different signal modulation caused by T2* can be produced, according to the principle of the multipoint Dixon (see references [4] and [12]) or also PEPSI method (see reference [10]), and parameter maps of the local field homogeneity and/or the local T2* times can thereby be determined. Unlike conventional methods, in this case the zero point of the T2* development is directly accessible to measurement by selection of a TE=TE.

In a further preferred implementation of the methods shown in FIGS. 4 and 5, δω is chosen such that it covers the range of the resonance frequency of water or fat. The formed signal is then rephased at the echo time instant TE only for the desired range (water or fat): signals of the unwanted range are dephased and, depending on the amplitude profile in the relevant frequency range, suppressed.

Figure 6A:
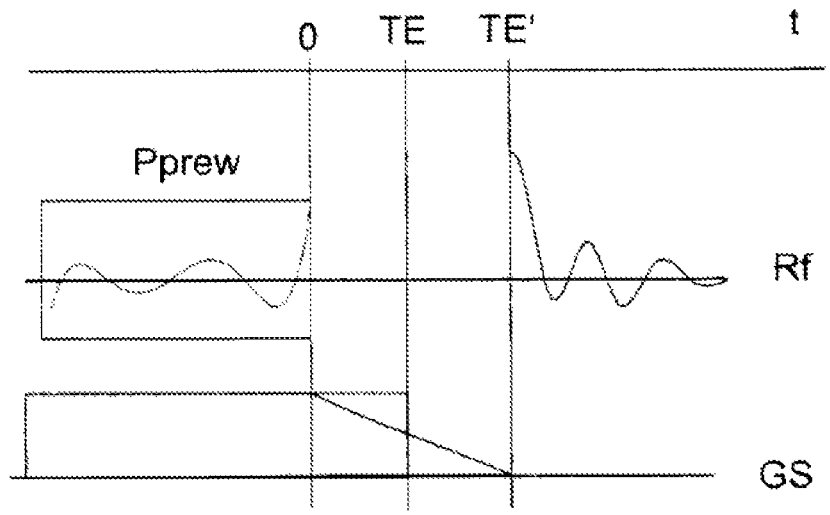
FIG. 6a the use of the prewinding pulse Pprew in conjunction with a slice selection gradient GS. With a still constant gradient GS after the end of the pulse, the echo is produced at instant TE. Self-refocusing occurs at instant TE'=2TE with linear switch-off of the gradient.

A further group of preferred applications is shown in FIG. 6. Here, the prewinding pulse Pprew is used in the presence of a slice selection gradient with amplitude Amp. If the gradient is left unchanged and constant after the end of the pulse (dotted line in FIG. 6a), the self-refocusing is performed at instant TE. If the gradient is switched off after the pulse (t=0), self-refocusing is performed at an instant TE', which is then reached when the area under the gradient between 0 (end of the pulse) and TE' corresponds to the area under the constant gradient until instant TE:

$$\int_0^{TE'} GS(t)dt = Amp \cdot TE. \quad (6)$$

With linear decline of GS—shown in FIG. 6a—TE'=2 TE. However, in this case, only the variations of the Larmor frequency are refocused due to the slice gradient at instant TE'. Signals with off-resonances undergo T2*-dependent signal modulation in accordance with the time difference TE'-TE.

Such an implementation is especially advantageous for achieving very short echo times TE'. In a magnetic resonance tomograph, a certain 'dead time' between the end of the RF pulse and the beginning of data readout is generally necessary due to the technical characteristics of the coils and receiving electronics. The dead time is typically in the range of a few microseconds to approx. 100 μs. Even if extremely short, hard pulses are used, with subsequent readout of the formed signal as free induction decay (FID), the instant of signal coherence (=start of the FID) is not read out, which results in T2*-dependent signal attenuation. Moreover, the spectrum formed by Fourier transformation of an incomplete FID exhibits a complex, frequency-dependent phase that is difficult to correct.

Due to use of a prewinding pulse, the FID can be read out completely. This permits spectroscopic measurements with very short echo times TE'.

Figure 6B:
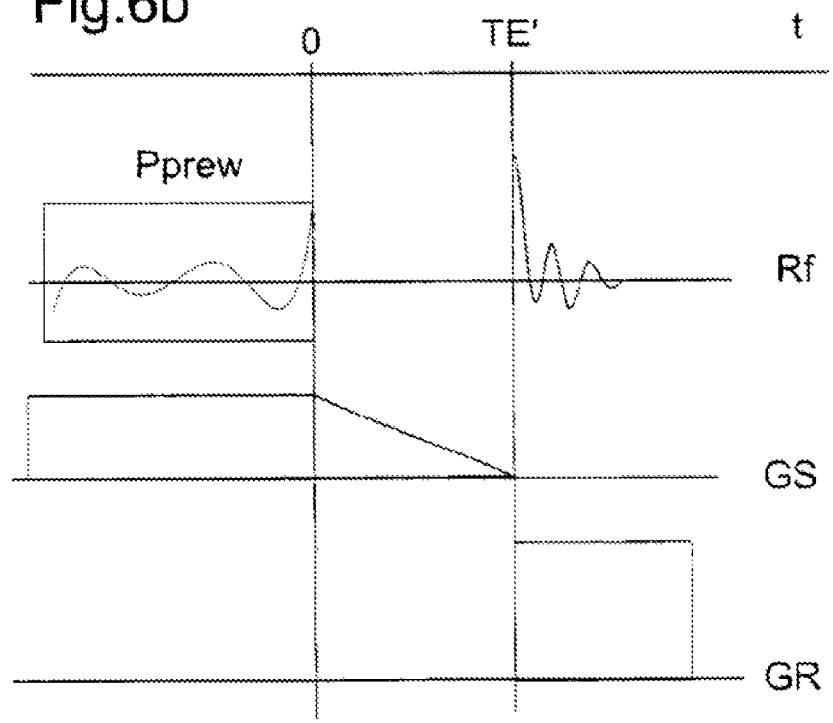
FIG. 6b a sequence as in FIG. 6a, but with spatially encoded readout of the signal as a half-echo under a readout gradient GR. In addition, phase encoding was possible during run-down of the slice gradient.

FIG. 6b shows the method shown in FIG. 6a in conjunction with a spatial encoding gradient GR. This is switched on at instant TE'; the signal is therefore read out as a so-called half echo. For 2 (or 3) dimensional spatial encoding, the principle of radial spatial encoding is advantageously used, wherein the direction of the readout gradient is continuously changed in successive acquisition steps.

Figure 7A:
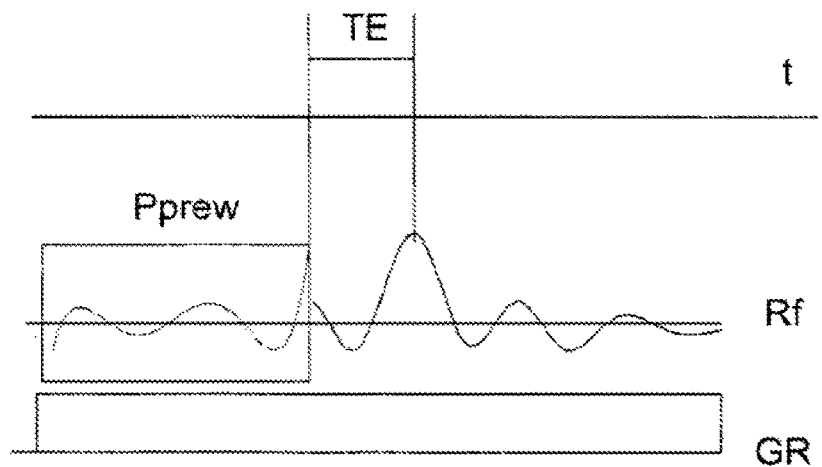
FIG. 7a a sequence during which the pulse and readout of the signal are performed under a readout gradient GR. The direction of GR can be varied so that the 2 or 3-dimensional k-space is radially sampled. This corresponds to a spherical 'field of view'.

FIG. 7 finally shows an implementation of the method under a constant readout gradient GR. The spectrum generated by Fourier transformation of the formed echo exhibits a constant phase over the frequency range Δω, wherein, over the gradient GR, Δω corresponds to a range Δr in real space. Δω is thereby chosen such that Δr is located symmetrically around the zero point of the gradient. If the acquisition is repeated while continuously changing the direction of the gradient GR according to 3-dimensional radial spatial encoding, a three-dimensional data set can be produced (FIG. 7a). For localized imaging in a spherical volume with diameter Δr, the acquisition can be performed with undersampling (see reference [13]). Signals outside this volume appear dephased and weakened by dephasing and can be ignored. In particular, spin echo type acquisitions with very short echo times can thereby be produced. In addition to spatial encoding with isotropic angle distribution of the acquired projections, in an analogous way to known methods, this method is suitable for fast acquisition, possibly with anisotropic distribution of the spatial angles ('golden angle') (see reference [11]). With use of fast repetition and a pulse profile of the prewinding pulse with large flip angles outside Δω (as in FIG. 3), additional signal saturation can be achieved in the unwanted marginal range.

Figure 7B:
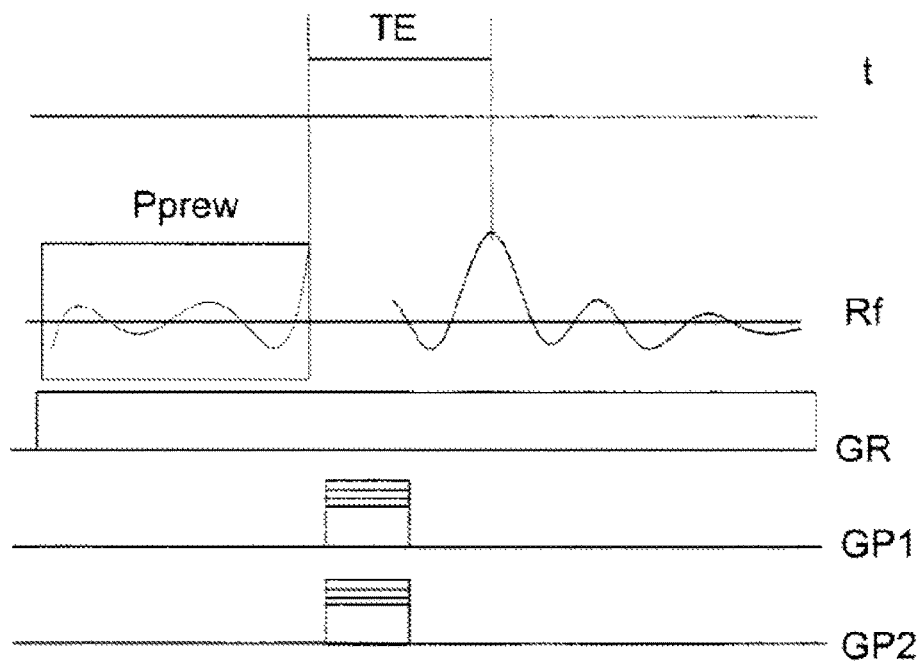
FIG. 7b a sequence such as in FIG. 7a, with the difference that k-space sampling is not performed radially but in the same direction as GR and the other spatial directions are phase-encoded. In this case, a slice is excited in the direction of GR whose thickness results from $\Delta\omega$ and the gradient strength of GR.

Moreover, GR can be left constant in one direction. In this case, a slice is excited whose thickness results from Δω and the gradient strength. The two remaining spatial directions can be encoded with phase encoding between excitation and data readout (FIG. 7b). During phase encoding, the readout gradient GR can optionally remain switched on or be switched off for a short time. The echo time results depending on the area under GR.

The previous description was limited to discussion of the possibilities of prewinding pulses with reference to the characteristic feature of the negative slope of the phase course in the range Δω. Methods are described below that are concerned with controlled modulation of the frequency ranges outside Δω.

As shown in FIG. 8, with relevant specifications of the achieved phase and amplitude course outside Δω, numerous pulses can be generated that exhibit an identical phase and amplitude course within Δω. To suppress the generally unwanted signals outside Δω, it is generally advantageous to achieve the strongest possible and positive slope of φ(ω) for these ranges while at the same time keeping the amplitude low. As already described, use of a profile with high amplitude in the unwanted range in conjunction with short repetition times TR during data acquisition can be used for signal saturation outside Δω.

With use of small-angle approximation (linear approximation of the Bloch equation)—as in the examples shown—the duration of the pulse is directly correlated with the slope $d\varphi_0/d\omega$ in the range Δω due to the properties of the Fourier transformation. Pulses with short duration and large negative slope $d\varphi_0/d\omega$ can be generated with the non-linear methods (optimal control, etc.) already mentioned.

It should also be pointed out that, in those methods in which the prewinding pulse is used below a spatial encoding gradient (FIGS. 6 and 7), a change of the pulse and gradient shape according to the principle of the VERSE method (see reference [3]) can be used to minimize either the pulse duration or possibly also the maximum pulse power.

A further preferred implementation of an inventive pulse will first be explained by means of a generic pulse that is composed of two hard pulses. The transition to more practical pulses will then be illustrated, including an estimation of the possibilities and limits of inventive pulses.

Figure 9:
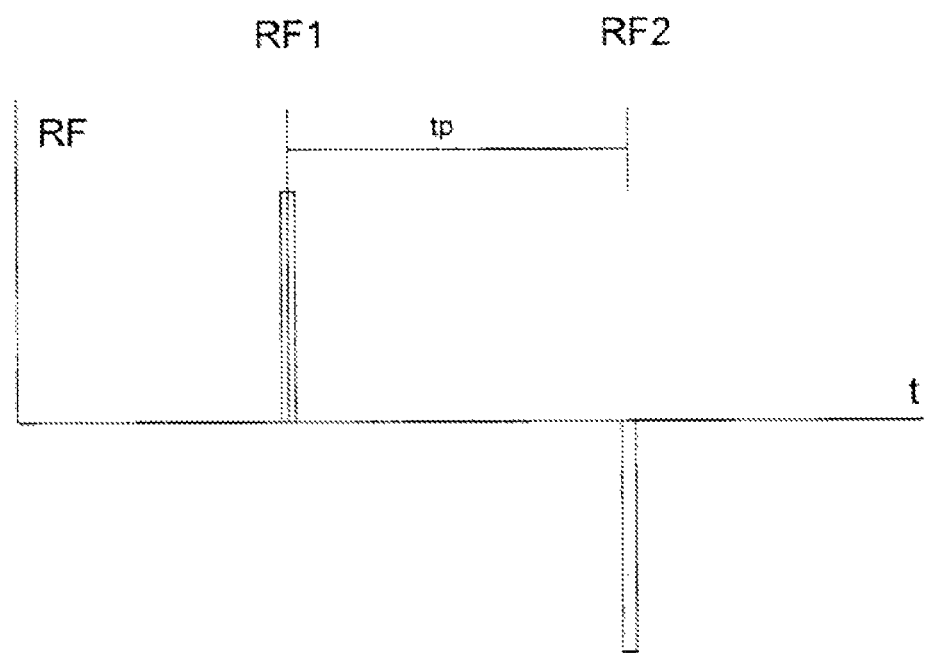
FIG. 9 a generic pulse, which consists of two hard pulses with opposite signs.

A generic pulse consists of the sequence of 2 radio-frequency pulses $RF_1$ and $RF_2$ with flip angle $\alpha_1$ and $\alpha_2$ and negligible length, these having a distance tp (FIG. 9) between them. This is to act upon a set of spins, which are distributed over a frequency interval $\omega = \omega_0 +- \delta\omega$ with constant amplitude $|M(\omega)|$, wherein δω is small compared to π/tp.

Initially, case 1 is considered with $\alpha_1 = 90°$ and $\alpha_2 = -90°$ with negligible length of the single pulses. As shown in FIG.

10, the z-magnetization (FIG. 10A) is initially rotated through $RF_1$ to the y-axis (FIG. 10B). The isochromates fan out in the following time tp by an angle $\varphi_{tp}$=+−δω*tp (FIG. 10C). Due to the pulse $RF_2$, the magnetization is rotated back in the z-direction again (FIG. 10D). As can be seen from FIG. 10D, the total magnetization is now in the x-z plane.

The further development of the magnetization is considered in the transverse plane. FIG. 11A shows the magnetization M1(0) at the end of the total pulse (t=0) according to FIG. 10D. The two end points according to ω=ω₀+−δω are drawn as thick dots for better illustration. In time tc=/π(2ω), the two isochromates accumulate, with maximum frequency (+−δω), a phase of π/2 and meet on the x-axis (FIG. 11B). The semicircle corresponds to the precession path of the isochromates with +−δω. Isochromates with lower off-resonance frequency precess correspondingly more slowly. The total signal according to the sum of the transverse component of all isochromates is I1(tc). By numerical or analytical solution of the signal equation it can be shown that the maximum of the total signal and therefore the intensity I1(TE) of the spontaneous echo is achieved at an instant t=TEN 1.3*tc (FIG. 11C).

From this illustration, it is immediately clear that TE depends exclusively on δω and not on the pulse duration.

FIG. 11D shows the development over time of the signal intensity I1 for Δω=2δω=628 rad/s for tp=1 ms. The signal maximum is reached at instant TE=6.64 ms; the signal intensity is approx. 13% of the available magnetization.

Figure 11:
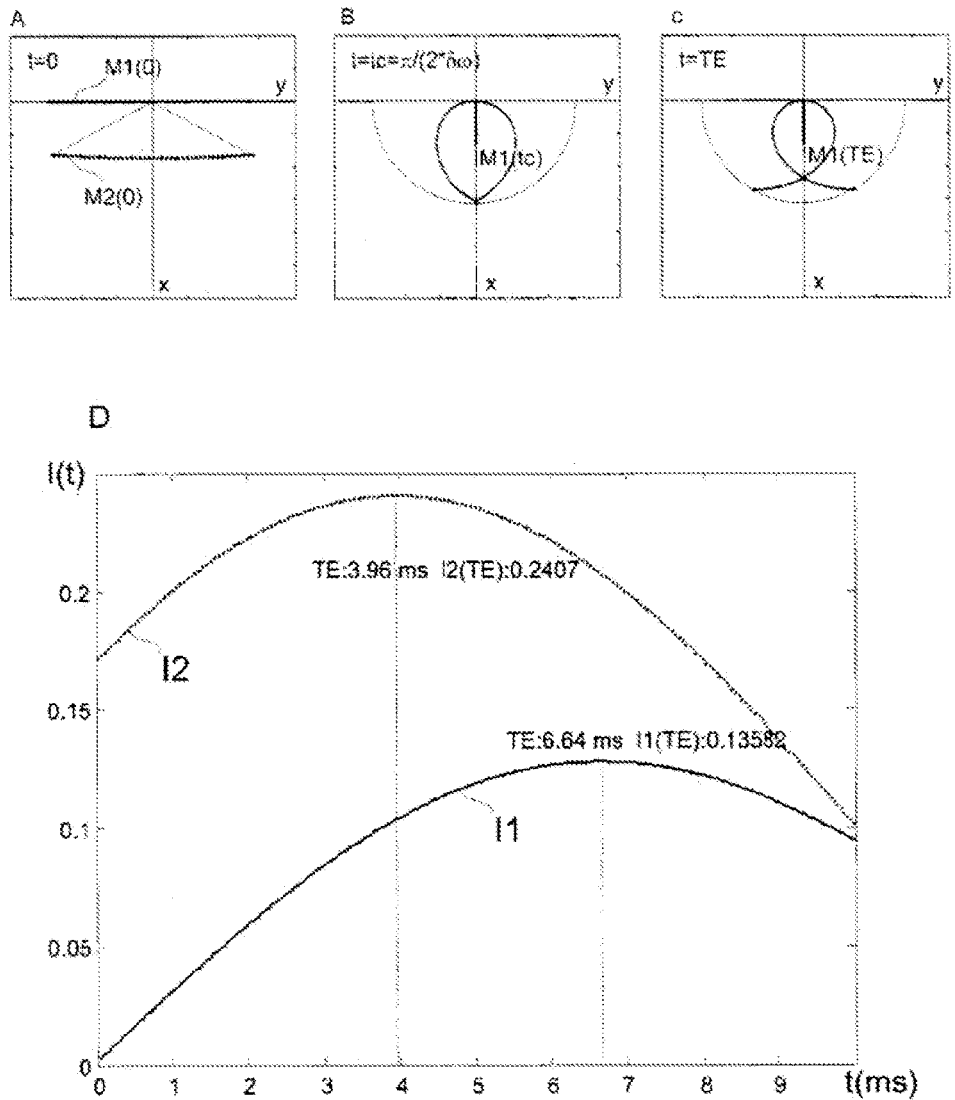
FIG. 11A the magnetization from FIG. 10 in the transverse representation for the 90°-(-90° (M1) and the 90°-(-100° (M2) pulse combination.
FIG. 11B the magnetization from FIG. 11A)(90°-(-90° combination) after an evolution time of $\pi/(2 \cdot \delta\omega)$. The semicircle represents the precession path of the outermost isochromates ($\pm\delta\omega$)
FIG. 11C the magnetization from FIG. 11A)(90°-(-90° combination) after an evolution time of $TE \approx 1.3 \cdot \pi/(2 \cdot \delta\omega)$. The semicircle represents the precession path of the outermost isochromates ($\pm\delta\omega$)
FIG. 11D the signal that results from the complex sum of the magnetization M1 or M2 during free precession. The echo (highest point of the signal) is reached at a multiple of the pulse length (1 ms)
Figure 12:
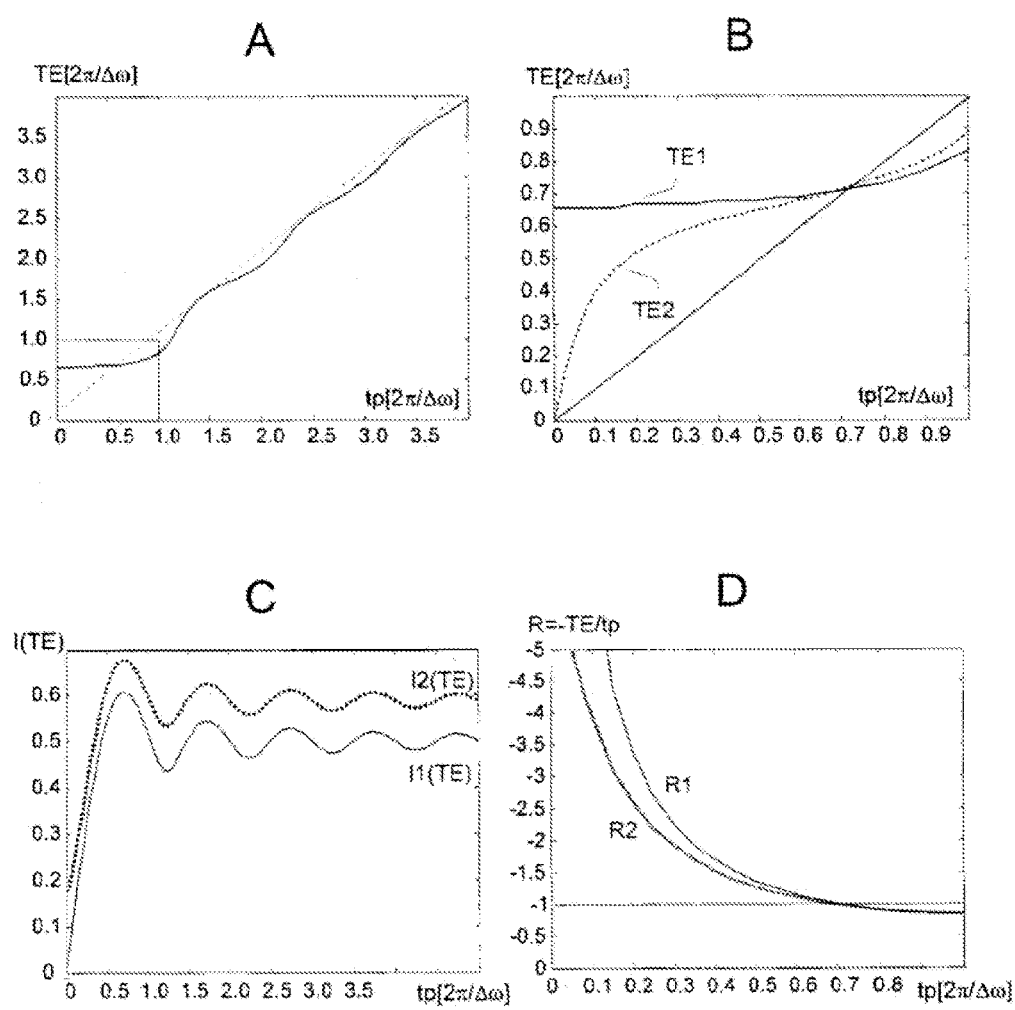
FIG. 12A the echo time as a function of the pulse length for the described combination of two hard pulses. It is easy to see that, in the range tp<1, the echo time hardly depends on the pulse length. For longer pulse durations, the behavior slowly transitions to Hahn echoes with TE=tp.
FIG. 12B the part relevant for the inventive pulse from FIG. 12A enlarged. Both the 90°-(-90° (TE1), and the 90°-(-100° combination (TE2) are shown. It can be seen that their behavior for tp<<1 greatly differ from each other. However, for 0<tp<0.7, both curves are above the original straight lines of slope 1.
FIG. 12C the signal intensity at the echo time for the two hard pulse combinations. It can be seen that I2 (90°-(-100° achieves higher values in total. This can be understood as arising because the total flip angle for the on-resonant spins is not equal to zero.
FIG. 12D the dimensionless factor R, for comparison with the ideal Hahn echo (R=-1). For tp<0.7, echo times can be produced that are greater than the length of the pulse.

FIG. 12A shows the dependency of the echo time TE on the pulse duration tp. The pulse duration tp is expressed in units of 2π/Δω. It becomes clear that the derivation shown in FIGS. 11 and 12 for pulse durations in the range of weak dephasing (tp≲0.7·2π/Δω) is valid. With stronger dephasing during tp, the echo time approximates to the 'Hahn echo' regime and TE=tp applies.

The range of weak dephasing that is relevant for the inventive method is shown magnified in FIG. 12B.

FIG. 12C shows the echo amplitude I1(TE) as a function of Δω. For strong dephasing, this approximates to the value of 50% expected for a refocusing pulse of 90°.

FIG. 12D shows the dimensionless factor R=−tp/TE as compared with the formation of a conventional spin echo (TE=tp).

The illustration shown so far permits an intuitive understanding but is not necessarily an optimum implementation. As shown in FIG. 12C, the signal intensity is very small. An increase in the echo amplitude can be achieved easily by selecting a magnitude of $\alpha_2$>90° ($\alpha_2$ smaller than −90° therefore). As shown in FIG. 10A for $\alpha_2$=−100°, the magnetization M2(0) formed at instant t=0 already exhibits an x-magnetization differing from 0, which results in an increase of the signal I2 subsequently formed (FIG. 10C). Because the angle of aperture of the isochromates at $\alpha_2$=−90° is smaller than case 1 and therefore smaller than 180°, the echo time is reduced. In FIGS. 12B and D, this is shown based on the diagrams for TE2 vs. tp or R2 vs. tp (dashed lines).

For a given Δω=2δω and a desired echo time TE, the flip angle $\alpha_2$ that is optimal for the specific application can be calculated in this way.

Figure 13:
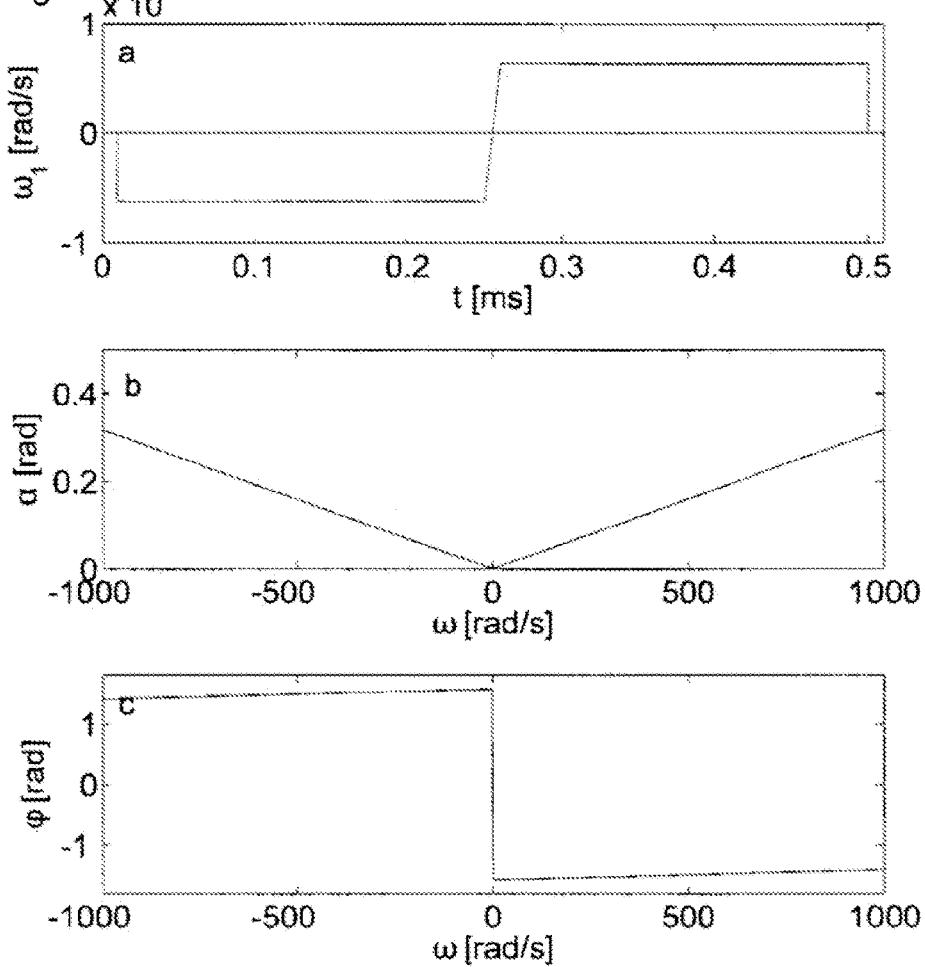
FIG. 13 a generic pulse, which is composed of a $\pi/2$ and a $-\pi/2$ pulse (a) with $\omega_1 = \gamma B_1$. The result is a flip angle of 0 for the on-resonant spin isochromate and a linear rise of the flip angle with the off-resonance frequency (b). The phase makes a jump of $\pi$, so that the isochromate pairs comprising $\omega$ and $-\omega$ gradually converge as a function of their absolute value (c). The instant of the maximum signal (echo) primarily depends on the available frequencies w.

In the previous consideration, the pulses were assumed to be delta pulses. In practical implementation, this is impossible. An efficient implementation is achieved with a pulse with constant amplitude and a total length 2*tp, at which $\alpha_1$=−$\alpha_2$=90° applies, so that the phase pulse is shifted by 180° in the middle of the pulse. Such a pulse is depicted in FIG. 13. $\omega_1$ corresponds therein to the nutation frequency and, for the pulse shown, $\omega_1$·tp=π/2 applies.

Of course, other flip angles can be chosen for both of the pulse parts. FIG. 13b, c shows the resulting flip angle α and the phase as a function of the off-resonance frequency. In accordance with FIG. 11A, the latter exhibits a jump by π in the on-resonance frequency.

Figure 10:
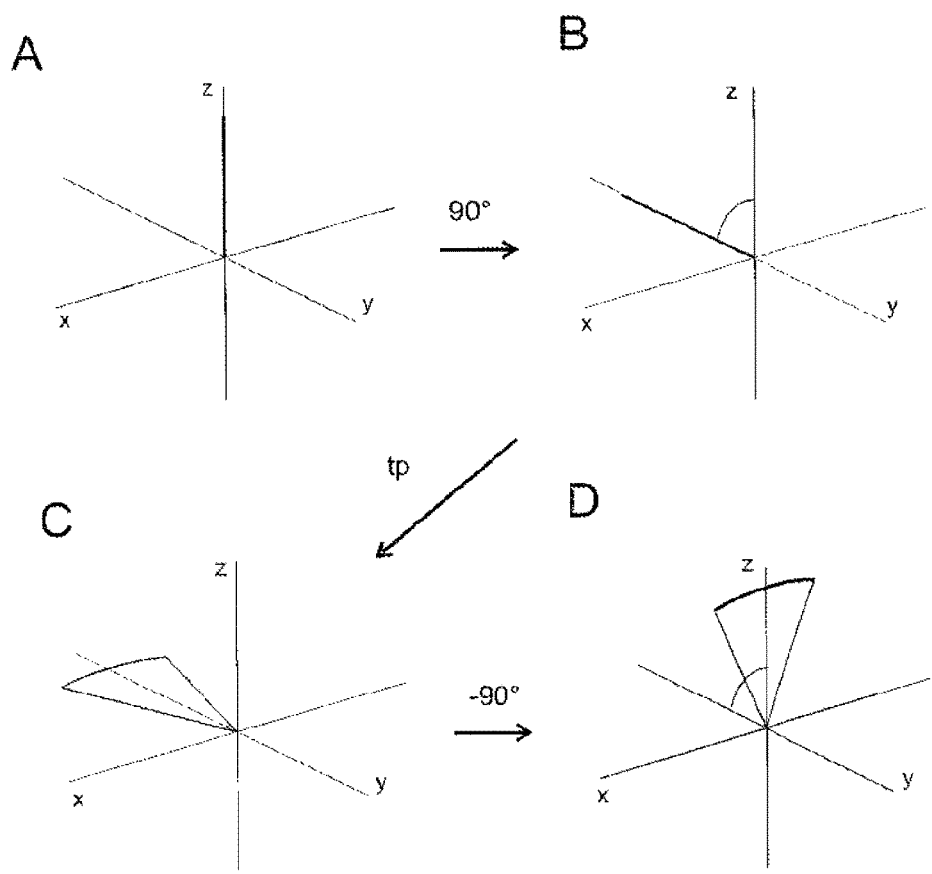
FIG. 10 the effect of the pulse of FIG. 9. The magnetization is initially tilted into the transverse plane, where it is dephased. A $-90°$ pulse guides the magnetization back into the x-z plane.

Because, for the inventive implementation, tp<<2π/Δω is chosen, the bandwidth of the selected pulses is sufficiently large so that the calculations derived from the 'hard pulse' approximation and shown in FIG. 10-12 still apply as a good approximation. However, the end of the pulse is shifted by tp/2 and TE is therefore shortened by tp/2.

The previous calculations refer to the case of magnetization that is constant in the range ω=ω₀+−δω; such a case can, for example, be achieved by applying a constant gradient over a homogeneously filled vessel.

If the distribution of the isochromates arises due to local field inhomogeneities, this is generally not satisfied; for stochastic local field changes, a Cauchy distribution of the isochromates is frequently assumed. This changes the numeric values of the calculations shown, but the line of argument is still valid in qualitative terms. By determination of TE for given parameters tp, $\alpha_1$, and $\alpha_2$, a measure of the type of microscopic field distribution can be found.

Figure 14:
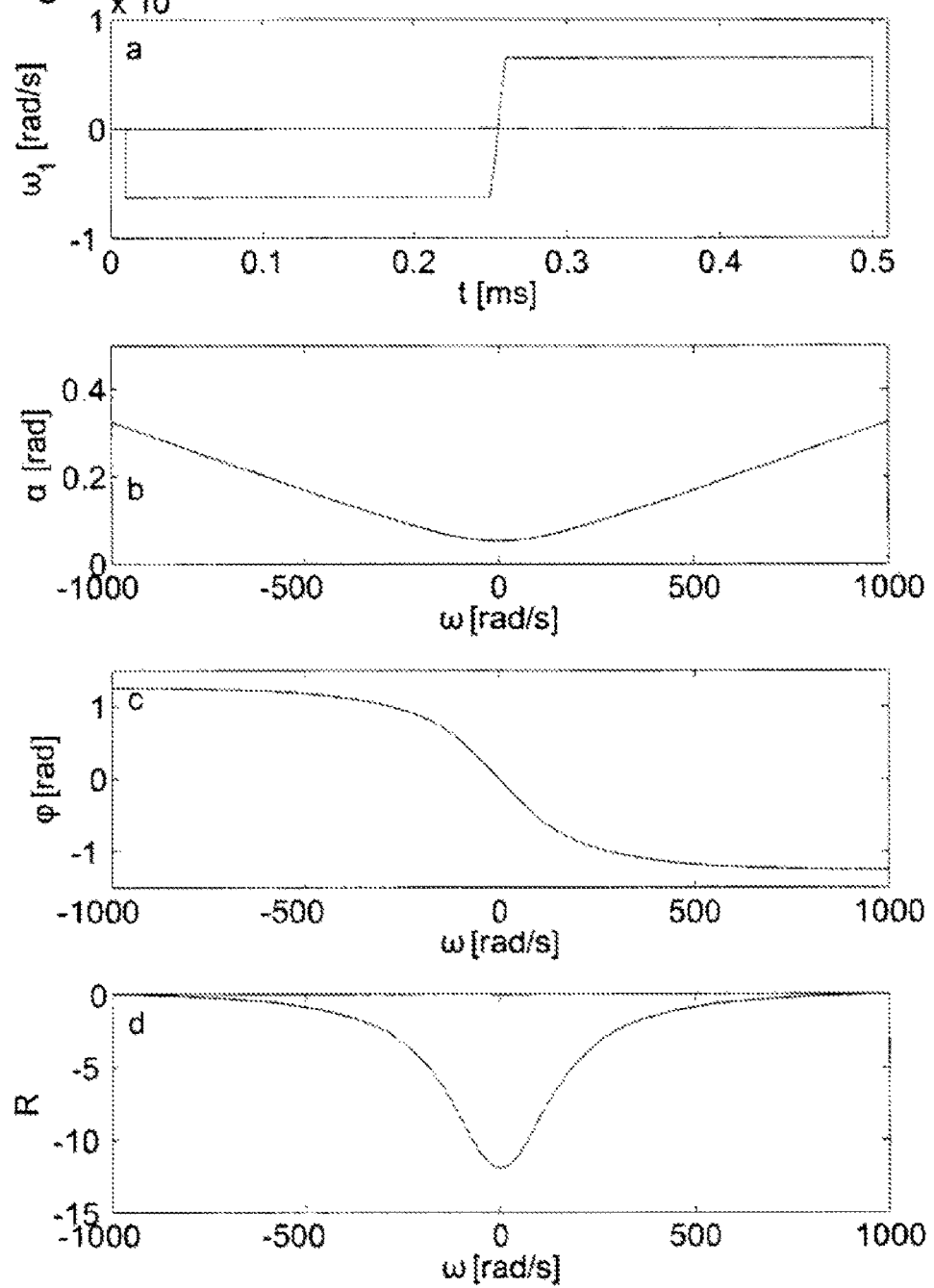
FIG. 14 a generic pulse, which is composed of a $\pi/2$ and a $-\pi/2-0.2$ pulse (a). Only the real part of the pulse is shown, the imaginary part is negligible in the case of this special pulse, which is not necessarily the case for all inventive pulses. The result is a flip angle of 3° for the on-resonant spin isochromate and a rise of the flip angle with the absolute value of the off-resonance frequency (b). The phase now no longer makes a jump, as compared with FIG. 4, but describes a steep edge (c). The normalized slope R achieves values |R|>10, so that the spins refocus near to the resonance frequency only a good 5 ms thereafter (d)

In an analogous way to the hard pulse combination 90°-(−100°), the pulse from FIG. 13 can be modified to become a π/2−(−π/2−0.2) (FIG. 14). In this case, the resulting flip angle for all isochromates is greater than zero and the phase does not exhibit a jump but a continuous ramp. For dimensionless description, the factor R stated above can also be described by the slope of the phase as a function of the frequency:

$$R = \frac{1}{tp}\frac{d\varphi_0}{d\omega}.$$

Therein, $\varphi_0$, denotes the phase at the end of the pulse. If R>0, this means that all isochromates are in phase after the excitation. If R<0, a spin echo is formed at instant TE=−R·tp. In the regime of the Hahn echo, R=−1 always applies for delta pulses and R>−1 always applies for real pulses.

The principle of the inventive pulses can generally be described by the fact that the magnetization is not directly taken to the desired target flip angle $\alpha_z$, but to flip angles α(t), which are defined by $\alpha_z$<α(t)<n−$\alpha_z$. At these flip angles, the spins dephase. As shown below, the dephasing can be strengthened by the transition to smaller flip angles $\alpha_z$. If the magnetization ramp dφ/dω is inverted, a spin echo arises at the end of the pulse. The echo time is not limited by a lower limit because complete dephasing is not a precondition for it (cf. Hahn echoes). As is shown below, the echo time (measured as of the end of the pulse) is also not limited to TE<$T_P$ if the target flip angle $\alpha_z$≠π/2 is selected. $T_P$ describes the length of the pulse.

To estimate the possible echo times, the on-resonant spin isochromate in the rotating reference system at ω₀=0 and a further isochromate with frequency ω on the Bloch sphere with radius 1 are considered. For geometrical considerations, $B_1$ fields of any strength must be able to take effect. The flip angle can therefore be changed at any rate. However, all $B_1$ fields act on all isochromates. A distance between isochromates as defined by the Euclidean norm can therefore only be achieved by precession of the spins as a consequence of their different Larmor frequencies and can therefore only be indirectly influenced.

In spherical coordinates, the position of each isochromate on the Bloch sphere can be described by the flip angle α and the phase φ.

Irrespective of the flip angle, the two isochromates are separated after an infinitesimal time step dt by the phase $$d\varphi = \omega \cdot dt.$$

Through a change to the Cartesian coordinate system, the distance between the two isochromates in the Euclidean norm is described by $$d\delta = \omega \cdot dt \sin \alpha$$

where α describes the flip angle at which dδ was produced. By derivation, it can be shown that the greatest change in the distance dδ is achieved at $\alpha_{max} = \pi/2$. In this case, the following applies $$d\delta_{max} = \omega \cdot dt.$$

If the magnetization is now folded toward the target flip angle $\alpha_z \neq \pi/2$ and the Euclidean distance between the two isochromates is again described in spherical coordinates, the maximum achievable phase difference yields $$d\varphi_{max}(\alpha_z) = \frac{\omega \cdot dt}{\sin \alpha_z}.$$

This calculation has been set up for infinitesimally small times of free precession. It retains its validity as long as δ<<sin α, is satisfied. It must be understood as the upper limit for finite times and larger produced phase differences. The sign of the phase is irrelevant because, in this theoretical estimation, any speed of rotation of the magnetization is permitted and the sign can be changed at any rate. In the description above, delta-shaped pulses, separate from a time of free precession are assumed. This does not entail any loss in generality, because any pulse in a limit value consideration can be seen as a concatenation of infinitesimally small delta-shaped pulses followed by an infinitesimally small time of free precession.

Because of this geometrical estimation, it can be seen that, for $\alpha_z = \pi/2$, no more than $|R|=1$ can be achieved. However, for smaller flip angles larger values are also possible, i.e. a pulse of length $T_P$ can generate a phase ramp that generates a spin echo after a time $TE > T_P$ after the end of the pulse. However, the estimation only applies to $\alpha \neq n\pi \forall n \in 2\mathbb{Z}$, and not therefore to the pulses in FIGS. 9 and 13, which are a limiting case.

Inventive pulses make use of the described effect by initially taking the magnetization to flip angles close to π/2, where a large Euclidean distance quickly arises between the isochromates. The magnetization is then taken to the target flip angle $\alpha_z$, which is further from π/2. This results in phase ramp dφ/dω with a large absolute value. This concept is illustrated in FIG. 16. A sign inversion can be achieved, for example, by taking the magnetization to the "negative flip angle" $-\alpha_z$ and therefore inverting the phase ramp. Due to free precession, the negative phase ramp then automatically results in a spin echo whose instant is determined by the slope of the phase ramp.

To achieve complete rephasing of all spins with R=−1 with a flip angle of $\alpha_z = \pi/2$, magnetization must first be excited around π/2 and then refocused with a π pulse. Overall, therefore, a total rotation of 3π/2 is required. With very short total pulse lengths and limited $B_1$ amplitude, this total rotation can no longer be achieved. In limiting cases, in which the required rotation can just about be performed, the individual excitation and refocusing components are so long that R>>−1 results. By choosing flip angle $\alpha_z \neq \pi/2$, inventive pulses make it possible to break through these limits with finite $B_1$ fields and to achieve longer echo times than were previously possible in prior art.

A flip angle that is as constant as possible over the entire relevant frequency spectrum and simultaneous refocusing of all spins is usually desired. These conditions are only very poorly met by the generic pulses described so far. However, the principle can easily be applied to shaped pulses, which are optimized with respect to constant flip angle and linear phase course. By way of example, FIG. 16 shows a pulse that has been optimized by means of the 'optimal control' method in a range of $\pm\delta\omega = 1250$ rad/s onto a flip angle of 3° and R=−1.3. The pulse duration is 0.5 ms.

LIST OF REFERENCES

[1] Bloom, A. L., 1955. Nuclear Induction in Inhomogeneous Fields. Physical Review 98, 1105-1111.

[2] Conolly, S., Nishimura, D., Macovski, A., 1986. Optimal control solutions to the magnetic resonance selective excitation problem. IEEE Trans Med Imaging 5, 106-115.

[3] Conolly, S., Nishimura, D., Macovski, A., Glover, G., 1988. Variable-rate selective excitation. Journal of Magnetic Resonance (1969) 78, 440-458.

[4] Glover, G. H., 1991. Multipoint dixon technique for water and fat proton and susceptibility imaging. Journal of Magnetic Resonance Imaging 1, 521-530.

[5] Hahn, E. L., Maxwell, D. E., 1952. Spin echo measurements of nuclear spin coupling in molecules. Physical Review 88, 1070.

[6] Hennig, J., Nauerth, A., Friedburg, H., 1986. RARE imaging: a fast imaging method for clinical MR. Magn Reson Med 3, 823-833.

[7] Kiliptari, I. G., Tsifrinovich, V. I., 1998. Single-pulse nuclear spin echo in magnets. Physical Review B 57, 11554-11564.

[7a] K. O. Lim, J. Pauly, P. Webb, R. Hurd, A. Macowski, Short TE Phosphorus spectroscopy using a spin-echo pulse, MRM 32, 98-103 (1994).

[7b] P. Balchandani, M. Yamada, J. Pauly, P. Yang, D. Spielman, MRM 62, 183 (2009).

[7c] X. Wu, P. Xu, R. Freeman, "Delayed Focus Pulses for MRI: An evolutionary Approach" Mag. Res. in Med. vol. 20 pp. 165-170 (1991).

[7d] J. Shen, "Delayed-focus pulses optimized using simulated annealing", J. Magn. Reson. 149, 234-238 (2001).

[8] Meyer, C. H., Pauly, J. M., Macovskiand, A., Nishimura, D. G., 1990. Simultaneous spatial and spectral selective excitation. Magnetic Resonance in Medicine 15, 287-304.

[9] Pauly, J., Le Roux, P., Nishimura, D., Macovski, A., 1991. Parameter relations for the Shinnar-Le Roux selective excitation pulse design algorithm [NMR imaging]. IEEE Trans Med Imaging 10, 53-65.

[10] Posse, S., Dager, S. R., Richards, T. L., Yuan, C., Ogg, R., Artru, A. A., Müller-Gartner, H.-W., Hayes, C., 1997. In vivo measurement of regional brain metabolic response to hyperventilation using magnetic resonance: Proton echo planar spectroscopic imaging (PEPSI). Magnetic Resonance in Medicine 37, 858-865.

[11] Prieto, C., Uribe, S., Razavi, R., Atkinson, D., Schaeffter, T., 2010. 3D undersampled golden-radial phase encoding for DCE-MRA using inherently regularized iterative SENSE. Magnetic Resonance in Medicine 64, 514-526.

[12] Reeder, S. B., McKenzie, C. A., Pineda, A. R., Yu, H., Shimakawa, A., Brau, A. C., Hargreaves, B. A., Gold, G. E., Brittain, J. H., 2007. Water-fat separation with IDEAL gradient-echo imaging. Journal of Magnetic Resonance Imaging 25, 644-652.

[13] Scheffler, K., Hennig, J., 1998. Reduced circular field-of-view imaging. Magnetic Resonance in Medicine 40, 474-480.

[14] U.S. Pat. No. 7,425,828 B2

[15] US 2005/0127911 A1

We claim:

1. A method of magnetic resonance for examination of a sample introduced into a measurement volume within an external magnetic field, the method comprising the steps of:
   a) exciting the sample using an excitation pulse, wherein the excitation pulse is a prewinding pulse generating a transverse magnetization $M_\perp(\omega)$ of spins of different Larmor frequency $\omega$ after the excitation pulse, the transverse magnetization having a phase $\varphi_0(\omega)$, wherein $\varphi_0(\omega)$, as a function of $\omega$ within a predefined frequency range $\Delta\omega$, has an approximately linear course with negative slope, such that spins refocus to form a spin echo after an end of the excitation pulse at an echo time, wherein the echo time is defined by the excitation pulse and is larger than the duration of the excitation pulse, with no additional refocusing pulse or refocusing gradient thereby being necessary; and
   b) reading out, after a time interval and using a receiving coil, a signal formed by the transverse magnetization produced in step a).

2. The method of claim 1, wherein a time profile of an amplitude and a phase of the prewinding pulse is calculated by solving Bloch equations inversely and the prewinding pulse is produced accordingly.

3. The method of claim 1, wherein the prewinding pulse is calculated using a Shinnar-Le Roux method.

4. The method of claim 1, wherein the prewinding pulse is calculated by an optimal control method.

5. The method of claim 1, wherein the signal is read out spatially encoded in 1, 2, or 3 dimensions by means of time-variable magnetic field gradients, wherein a spatial encoding is performed using at least one of a conventional method, Fourier encoding, radial imaging and spiral imaging.

6. The method of claim 1, wherein the signal is read out after a delay, thereby undergoing a defined, freely selectable T2*-dependent modulation of amplitude and/or phase.

7. The method of claim 5, wherein a produced signal is refocused and read out one or more times at incremental readout times using single or multiple gradient inversion.

8. The method of claim 6, wherein a produced signal is refocused and read out one or more times at incremental readout times using single or multiple gradient inversion.

9. The method of claim 1, wherein the prewinding pulse is applied under a slice selection gradient of strength Amp, wherein the slice selection gradient is switched off after an end of the prewinding pulse and in such a manner that a time integral under the gradient corresponds to an action integral Amp*TE required for self-refocusing.

10. The method of claim 9, wherein a formed signal is read out under a readout gradient GR.

11. The method of claim 1, wherein both the prewinding pulse and the signal occur under a spatially encoded gradient GR.

12. The method of claim 11, wherein repetition of acquisition is carried out in a spatial direction other than 2 or 3-dimensional radial spatial encoding.

13. The method of claim 11, wherein repetition of acquisition is performed with different phase encoding steps between excitation and data readout.

14. The method of claim 9, wherein the prewinding pulse is switched under a time-variable gradient.

15. The method of claim 14, wherein the prewinding pulse is used under a time-variable gradient according to a VERSE method.

16. The method of claim 1, wherein the excitation pulse is chosen to initially take the magnetization to flip angles defined by $\alpha_z < \alpha(t) < \pi - \alpha_z$.

17. The method of claim 1, wherein the excitation pulse is chosen such that, with a limited maximum pulse amplitude, $Rmax(\alpha) < Rmax(90°)$ is achieved with a negative sign.

18. The method of claim 1, wherein the excitation pulse is chosen to have a constant amplitude and one or more phase jumps.

19. The method of claim 1, wherein an amplitude of the excitation pulse is shaped and changes sign at one or more points.

* * * * *

UNITED STATES PATENT AND TRADEMARK OFFICE
CERTIFICATE OF CORRECTION

PATENT NO. : 10,281,548 B2
APPLICATION NO. : 14/652129
DATED : May 7, 2019
INVENTOR(S) : J. Asslaender et al.

Page 1 of 1

It is certified that error appears in the above-identified patent and that said Letters Patent is hereby corrected as shown below:

On the Title Page

Item [72], please correct the address of the last listed inventor as follows:
-- Steffen Glaser, Garching (DE) --.

Signed and Sealed this
Sixteenth Day of July, 2019

Andrei Iancu
*Director of the United States Patent and Trademark Office*